United States Patent
Do et al.

(10) Patent No.: US 9,177,897 B1
(45) Date of Patent: Nov. 3, 2015

(54) INTEGRATED CIRCUIT PACKAGING SYSTEM WITH TRACE PROTECTION LAYER AND METHOD OF MANUFACTURE THEREOF

(71) Applicants: Byung Tai Do, Singapore (SG); Arnel Senosa Trasporto, Singapore (SG); Linda Pei Ee Chua, Singapore (SG); Henry Descalzo Bathan, Singapore (SG)

(72) Inventors: Byung Tai Do, Singapore (SG); Arnel Senosa Trasporto, Singapore (SG); Linda Pei Ee Chua, Singapore (SG); Henry Descalzo Bathan, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 13/930,319

(22) Filed: Jun. 28, 2013

(51) Int. Cl.
H01L 23/495 (2006.01)
H01L 21/00 (2006.01)
H01L 21/56 (2006.01)
H01L 21/48 (2006.01)

(52) U.S. Cl.
CPC ...... *H01L 23/49517* (2013.01); *H01L 21/4825* (2013.01)

(58) Field of Classification Search
CPC ..... H01L 23/495; H01L 21/56; H01L 21/565; H01L 23/49861; H01L 23/3128; H01L 2224/73204; H01L 2224/32145; H01L 2224/48091; H01L 2224/73265; H01L 21/4828; H01L 23/49848; H01L 23/49582; H01L 2924/3025; H01L 2224/00013; H01L 2924/00

USPC ......... 257/737, 738, 786, 784, 773, 774, 666, 257/698, 692–696, 676, E23.031, E21.505, 257/E21.506; 438/123
See application file for complete search history.

(56) References Cited

U.S. PATENT DOCUMENTS

| | | | |
|---|---|---|---|
| 6,255,740 B1 | 7/2001 | Tsuji et al. | |
| 6,964,918 B1 | 11/2005 | Fan et al. | |
| 7,232,755 B1 | 6/2007 | McLellan et al. | |
| 7,662,672 B2 | 2/2010 | Lin | |
| 7,741,149 B2 | 6/2010 | Qiao et al. | |
| 8,129,229 B1 | 3/2012 | Sirinorakul et al. | |
| 8,455,304 B2 | 6/2013 | Lam | |
| 8,987,060 B2 | 3/2015 | Yen | |
| 2005/0199995 A1 | 9/2005 | Nomoto et al. | |
| 2009/0302445 A1* | 12/2009 | Pagaila et al. | 257/678 |
| 2011/0074026 A1 | 3/2011 | Shim et al. | |
| 2011/0079885 A1* | 4/2011 | Camacho et al. | 257/676 |
| 2011/0227211 A1* | 9/2011 | Camacho et al. | 257/692 |
| 2012/0007234 A1 | 1/2012 | Tsai et al. | |
| 2012/0139104 A1* | 6/2012 | Camacho et al. | 257/737 |
| 2012/0146200 A1 | 6/2012 | McMillan et al. | |
| 2012/0181680 A1 | 7/2012 | Li | |
| 2012/0205811 A1* | 8/2012 | Do et al. | 257/773 |

(Continued)

OTHER PUBLICATIONS

U.S. Appl. No. 13/930,287, filed Jun. 28, 2013, Dimaculangan et al.

(Continued)

*Primary Examiner* — Alexander Oscar Williams
(74) *Attorney, Agent, or Firm* — Ishimaru & Associates LLP

(57) ABSTRACT

An integrated circuit packaging system and method of manufacture thereof including: providing a pre-plated leadframe having a contact protrusion and a protective pad on the contact protrusion; forming a contact pad and traces by etching the pre-plated leadframe; applying a trace protection layer on the contact pad, the traces, and the protective pad; removing the protective pad and a portion of the trace protection layer for exposing the contact pad; and depositing an external connector directly on a surface of the contact pad.

20 Claims, 10 Drawing Sheets

(56) References Cited

U.S. PATENT DOCUMENTS

| | | | |
|---|---|---|---|
| 2012/0241973 A1* | 9/2012 | Chua et al. | 257/774 |
| 2012/0280376 A1* | 11/2012 | Do et al. | 257/675 |
| 2012/0280377 A1* | 11/2012 | Do et al. | 257/676 |
| 2012/0280407 A1* | 11/2012 | Do et al. | 257/778 |
| 2013/0154072 A1* | 6/2013 | Do et al. | 257/676 |
| 2013/0154119 A1* | 6/2013 | Do et al. | 257/778 |
| 2013/0256861 A1* | 10/2013 | Do et al. | 257/676 |
| 2014/0008774 A1* | 1/2014 | Do et al. | 257/666 |
| 2014/0165389 A1* | 6/2014 | Do et al. | 29/825 |
| 2014/0167236 A1* | 6/2014 | Do et al. | 257/676 |
| 2015/0084172 A1 | 3/2015 | Do et al. | |

OTHER PUBLICATIONS

U.S. Appl. No. 13/930,261, filed Jun. 28, 2013, Do et al.

* cited by examiner

INTEGRATED CIRCUIT PACKAGING SYSTEM WITH TRACE PROTECTION LAYER AND METHOD OF MANUFACTURE THEREOF

CROSS-REFERENCE TO RELATED APPLICATION(S)

The present application contains subject matter related to concurrently filed U.S. patent application Ser. No. 13/930, 261. The related application is assigned to STATS ChipPAC Ltd. and the subject matter thereof is incorporated herein by reference thereto.

The present application contains subject matter related to concurrently filed U.S. patent application Ser. No. 13/930, 287. The related application is assigned to STATS ChipPAC Ltd. and the subject matter thereof is incorporated herein by reference thereto.

TECHNICAL FIELD

The present invention relates generally to an integrated circuit packaging system, and more particularly to a system formed from a leadframe.

BACKGROUND ART

Semiconductor chips have become progressively more complex, driven in large part by the need for increasing processing power in a smaller chip size for compact or portable electronic devices such as cell phones, smart phones, personal media systems, ultraportable computers.

There are a number of conventional processes for packaging integrated circuit (IC) dice. By way of example, many IC packages utilize a metallic leadframe that has been stamped or etched from a metal sheet to provide electrical interconnects to external devices. The die may be electrically connected to the leadframe by means of bonding wires, solder bumps or other suitable electrical connections.

In general, a leadframe will come from a supplier pre-plated with a desired pattern for further processing. The plating can protect selected portions of the leadframe during processing steps, and traces formed during processing require protection. The die and portions of the leadframe are encapsulated with a molding material to protect the delicate electrical components on the active side of the die while leaving selected portions of the leadframe exposed to facilitate electrical connection to external devices.

Thus, a need still remains for a better manufacturing system. In view of the rising costs of materials, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a pre-plated leadframe having a contact protrusion and a protective pad on the contact protrusion; forming a contact pad and traces by etching the pre-plated leadframe; applying a trace protection layer on the contact pad, the traces, and the protective pad; removing the protective pad and a portion of the trace protection layer for exposing the contact pad; and depositing an external connector directly on a surface of the contact pad.

The present invention provides an integrated circuit packaging system, including: an integrated circuit die; a contact pad connected to the integrated circuit die; traces connected to the contact pad; a trace protection layer on the contact pad and the traces, the trace protection layer having a recess with a top surface of the contact pad spaced a recess distance away from an exposed surface of the trace protection layer; and an external connector directly on the top surface of the contact pad.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
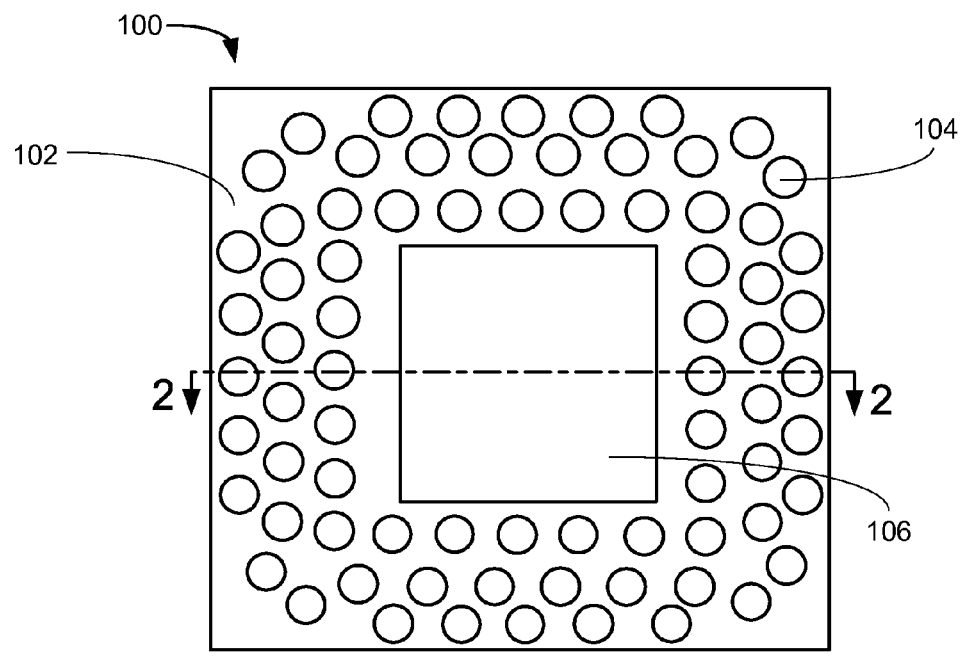
FIG. 1 is a bottom view an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the contact pad, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure.

The term "processing" as used herein includes deposition of material or photoresist, patterning, exposure, development, etching, cleaning, and/or removal of the material or photoresist as required in forming a described structure.

Referring now to FIG. 1, therein is shown a bottom view an integrated circuit packaging system 100 in a first embodiment of the present invention. The bottom view shows a trace protection layer 102, external connectors 104, and a die paddle 106.

The trace protection layer 102 protects and holds traces and contacts in place, and can be made from a material such as epoxy molding compound, resin, moldable underfill, a curable compound, or other non-conductive material. The trace protection layer 102 is shown as opaque, but it is understood that a translucent or transparent material may be used.

The external connectors 104, such as solder balls, can be connected to contact pads through the trace protection layer 102. The external connectors 104 function to electrically connect an integrated circuit die, which is mounted to an internal side of the die paddle 106, to the outside of the integrated circuit packaging system 100. The external connectors 104 can be arranged in an array as seen or can be arranged in a staggered, regular, or irregular array, for example. The die paddle 106 can function to dissipate heat or to provide a path to ground for the integrated circuit die.

Figure 2:
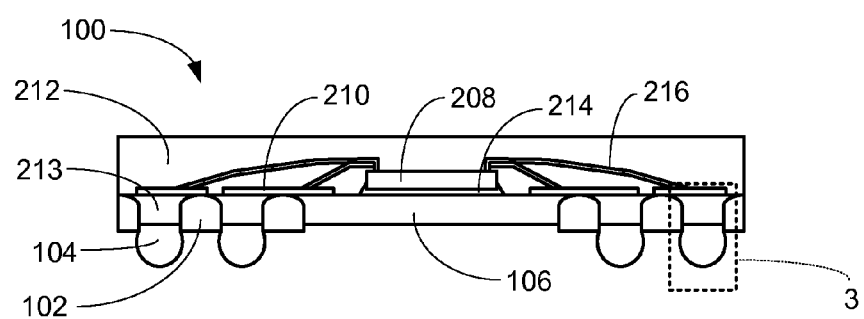
FIG. 2 is a cross-sectional view of FIG. 1 along the section line 2-2 of FIG. 1.

Referring now to FIG. 2, therein is shown a cross-sectional view of FIG. 1 along the section line 2-2 of FIG. 1. The cross-sectional view shows an integrated circuit die 208, bond structures 210, an encapsulation 212, contact pads 213, the die paddle 106, the trace protection layer 102, and the external connectors 104. The integrated circuit die 208, such as a wire-bond die or a flip chip die, can be mounted to the die paddle 106 using a die attach adhesive 214. The die attach adhesive 214 can contact the bottom and a portion of the sides of the integrated circuit die 208.

The die paddle 106 can be laterally surrounded by the contact pads 213, which are made from the same material as the die paddle 106. For example, the die paddle 106 and the contact pads 213 can be made from a conductive material such as copper or a copper alloy. The die paddle 106 and the contact pads 213 can have partially curved sides as a result of an etching process. The contact pads 213 are in direct contact with the external connectors 104 on a bottom surface and in direct contact with the bond structures 210 on a top surface. The bond structures 210 can be planar.

The bond structures 210 can route electrical signals from the integrated circuit die 208 to the contact pads 213 directly or through traces, which will be described in greater detail in a later figure. The bond structures 210 can be made of conductive material such as gold, silver, nickel, palladium, tungsten, or other metal. The integrated circuit die 208 is connected to the bond structures 210 and further to the contact pads 213 and the external connectors 104 through internal interconnects 216, such as bond wires, solder balls, conductive posts, or conductive columns.

The encapsulation 212 directly contacts the integrated circuit die 208, the bond structures 210, and the internal interconnects 216. The encapsulation 212 also is in direct contact with portions of the trace protection layer 102 between the contact pads 213. The encapsulation 212 can be made from a material such as epoxy molding compound, curable underfill, or other moldable compound.

The contact pads 213 and the die paddle 106 are recessed into the trace protection layer 102, such as a second encapsulation layer, and the external connectors 104 directly contact the material of the contact pads 213 without intervening plating. The external connectors 104 also directly contact the trace protection layer 102. The external connectors 104 also directly contact the trace protection layer 102, creating a stronger solder joint.

Figure 3:
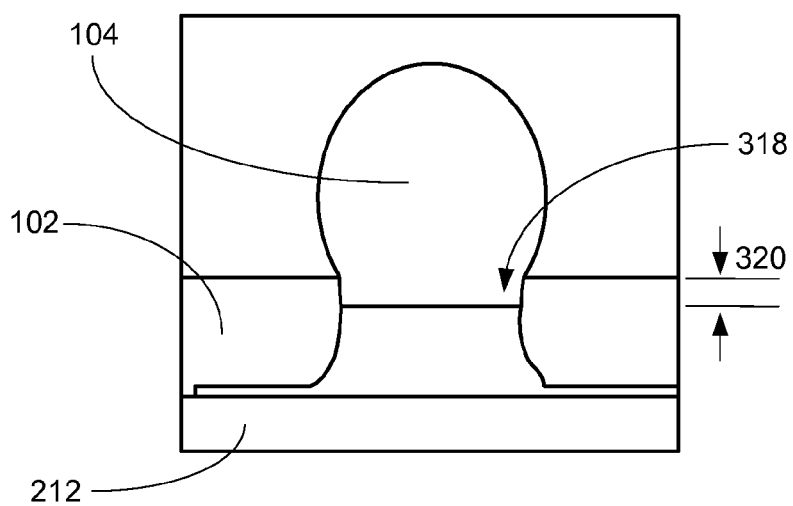
FIG. 3 is a detailed cross-sectional view of FIG. 2 within the inset depicted by the dotted rectangle 3 of FIG. 2.

Referring now to FIG. 3, therein is shown a detailed cross-sectional view of FIG. 2 within the inset depicted by the dotted rectangle 3 of FIG. 2. The detailed cross-sectional view is shown in a flipped orientation as compared to FIG. 2. The bond structures 210 and the internal interconnects 216 of FIG. 2 are omitted for clarity. Clearly seen at the left side of this view is the boundary between the encapsulation 212 and the trace protection layer 102. The encapsulation 212 and the trace protection layer 102 can be made from the same or different material, but as the encapsulation 212 and the trace protection layer 102 are applied at different times, a boundary between the two will always exist.

Also seen in this detailed view is a recess 318 in the trace protection layer 102 wherein a surface of the contact pads 213 is the bottom of the recess 318 and is a recess distance 320 below the exposed surface of the trace protection layer 102. The recess distance 320 is defined as the distance between the exposed surface of the trace protection layer 102 and the surface of the contact pads 213 closest to the exposed surface of the trace protection layer 102. The exposed surface of the trace protection layer 102 is flat and planar as a result of a backgrinding process, enhancing solder joint strength. One of the external connectors 104 can be seen in this detailed view.

Figure 4:
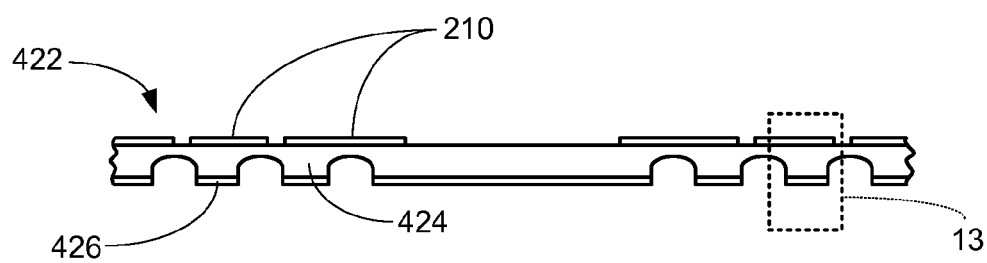
FIG. 4 is a cross-sectional view of FIG. 1 along the section line 2-2 of FIG. 1 in a beginning phase of manufacture.

Referring now to FIG. 4, therein is shown a cross-sectional view of FIG. 1 along the section line 2-2 of FIG. 1 in a beginning phase of manufacture. The cross-sectional view shows a pre-plated leadframe 422 having a number of contact protrusions 424, with the bond structures 210 and protective pads 426 shown pre-deposited on the pre-plated leadframe 422. Wavy lines at the sides of the figure indicate that only a portion of the structure is shown.

The pre-plated leadframe 422 can be pre-stamped or pre-etched metal, such as copper or a copper alloy, such that the contact protrusions 424 of the pre-plated leadframe 422 can function as the contact pads 213 and the die paddle 106 of FIG. 2 after further processing. The contact protrusions 424 can have curved sides as a result of an etching process. The contact protrusions 424 can be formed by etching through most or half of the thickness of the pre-plated leadframe 422. The protective pads 426 can be made from an etch-resistant material such as gold, platinum, palladium, nickel, or other etch-resistant metal.

Figure 5:
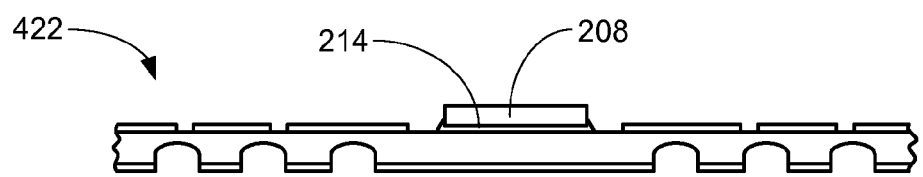
FIG. 5 is the structure of FIG. 4 in a die attach phase of manufacture.

Referring now to FIG. 5, therein is shown the structure of FIG. 4 in a die attach phase of manufacture. The integrated circuit die 208 is attached to a center of the pre-plated leadframe 422 using the die attach adhesive 214.

Figure 6:
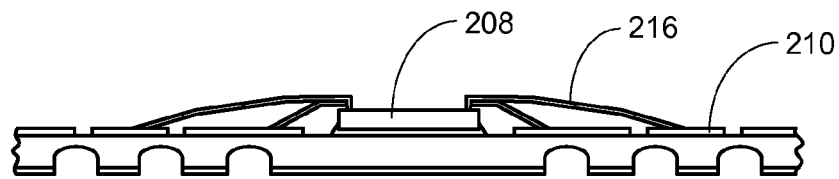
FIG. 6 is the structure of FIG. 5 in a wire bond phase of manufacture.

Referring now to FIG. 6, therein is shown the structure of FIG. 5 in a wire bond phase of manufacture. The integrated circuit die 208 is connected to the bond structures 210 through the internal interconnects 216. For example, the integrated circuit die 208 can be connected to various points of the bond structures 210 using bond wires.

Figure 7:
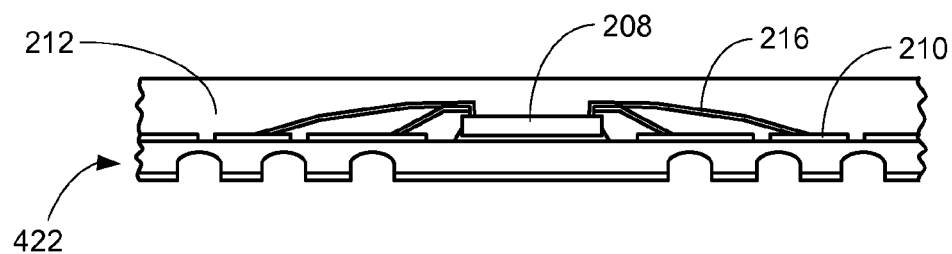
FIG. 7 is the structure of FIG. 6 in a first molding phase of manufacture.

Referring now to FIG. 7, therein is shown the structure of FIG. 6 in a first molding phase of manufacture. The integrated circuit die 208, the internal interconnects 216, one side of the pre-plated leadframe 422, and the bond structures 210 are covered by the encapsulation 212. The encapsulation 212 can be applied through a process such as injection molding, film-assist molding, or other encapsulation process.

Figure 8:
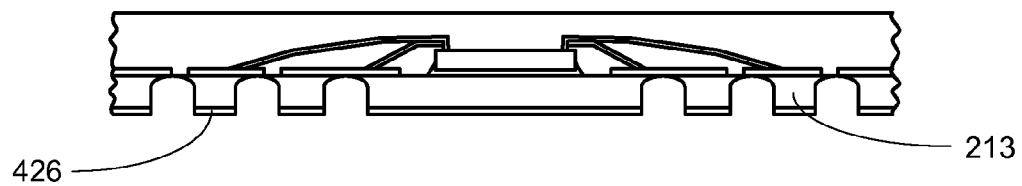
FIG. 8 is the structure of FIG. 7 in a first etching phase of manufacture.

Referring now to FIG. 8, therein is shown the structure of FIG. 7 in a first etching phase of manufacture. The protective pads 426 can protect a portion of the contact protrusions 424 of FIG. 4 from the etching process by resisting the etchant. The etching process can be anisotropic or isotropic and can etch away a portion of the contact protrusions 424, forming the contact pads 213 and traces and electrically separating the contact pads 213 from each other. The etchant can be formulated to only etch through the material between the contact protrusions 424.

Figure 9:
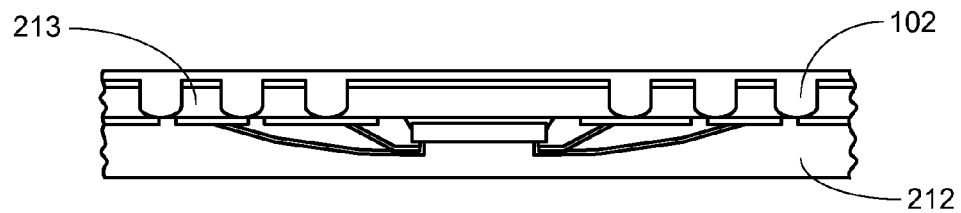
FIG. 9 is the structure of FIG. 8 in a second molding phase of manufacture.

Referring now to FIG. 9, therein is shown the structure of FIG. 8 in a second molding phase of manufacture. In this figure, the view is flipped as compared to FIG. 8. After the first etching step to form the contact pads 213, a second molding step is performed to apply the trace protection layer 102 to fully cover the contact pads 213. The trace protection layer 102 can be formed from the same material as the encapsulation 212 or from a different material. It is preferred for the purposes of preventing warpage and ease of manufacturing to use the same material as used to form the encapsulation 212.

It has been discovered that the use of the same material for the trace protection layer 102 as the encapsulation 212 helps prevent warpage issues in the completed package. Warpage of a package generally occurs due to differences in the coefficient of thermal expansion between different materials. When the trace protection layer 102 and the encapsulation 212 are made from the same material, their coefficients of thermal expansion are exactly matched, helping to prevent the package from warping. This can also help prevent delamination between the encapsulation 212 and the trace protection layer 102.

Figure 10:
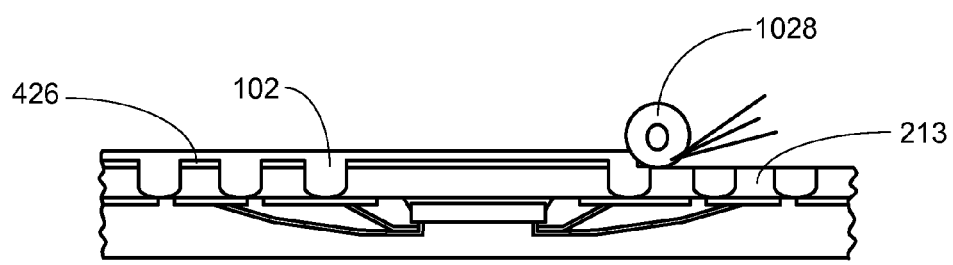
FIG. 10 is the structure of FIG. 9 in a backgrinding phase of manufacture.

Referring now to FIG. 10, therein is shown the structure of FIG. 9 in a backgrinding phase of manufacture. A backgrinding tool 1028 is shown in the process of grinding away a portion of the trace protection layer 102, the protective pads 426, and a portion of the contact pads 213. The backgrinding step leaves the surface of the trace protection layer 102 and the contact pads 213 coplanar and flat.

It has been discovered that the use of the backgrinding tool 1028 for backgrinding rather than a buffing or chemical mechanical polishing (CMP) process for removal of excess material leads to a faster, more reliable, and more cost-effective manufacturing process. Because the grinding process removes more material more quickly than buffing or CMP, larger tolerances in the application of the trace protection layer 102 are possible, allowing the use of equipment with lower precision than would otherwise be necessary. The trace protection layer 102 can be applied in a thick coating without impacting the manufacturing process.

It has also been discovered that the use of the backgrinding tool 1028 for backgrinding rather than buffing or CMP allows for better protecting of traces through the use of a harder material for the trace protection layer 102 than if using buffing or CMP. Because the grinding process is able to remove material at roughly the same rate whether hard or soft, a greater variety of materials, such as epoxy molding compound, become realistically useable for the trace protection layer 102 as compared to when buffing or CMP is used.

It has also been discovered that the use of the backgrinding tool 1028 rather than simply molding and curing the trace protection layer 102 on and around the contact pads 213 improves solder joint and material strength. Because the curing process for materials used in trace protection causes some amount of shrinkage and an uneven surface, it has been found that grinding a planar surface increases reliability by ensuring uniformity across the entire surface of the trace protection layer 102.

Figure 11:
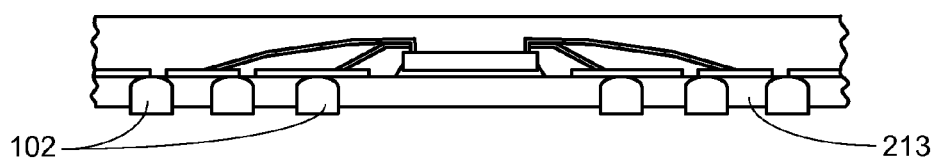
FIG. 11 is the structure of FIG. 10 in a second etching phase of manufacture.

Referring now to FIG. 11, therein is shown the structure of FIG. 10 in a second etching phase of manufacture. The view of FIG. 11 is shown flipped as compared to FIG. 10. Following the completion of the backgrinding process, a second etching step is performed to remove material of the contact pads 213 and to recess the contact pads 213 into the trace protection layer 102.

Figure 12:
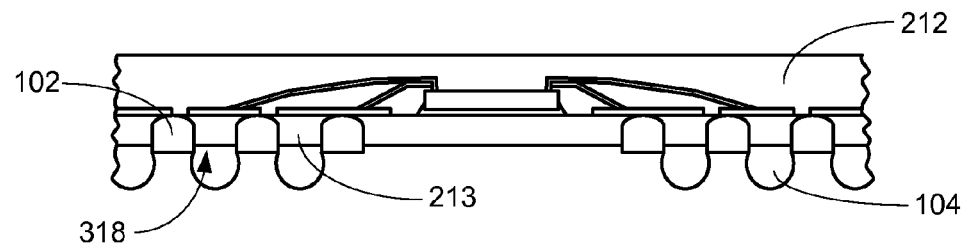
FIG. 12 is the structure of FIG. 11 in a ball attach phase of manufacture.

Referring now to FIG. 12, therein is shown the structure of FIG. 11 in a ball attach phase of manufacture. Following the second etching step to form the recess 318 in the trace protection layer 102, the external connectors 104 can be deposited directly in the recess 318, directly on the contact pads 213, and without using a solder-wettable plating layer. This can be followed by a reflow step where the external connectors 104 are reflowed to fully cover the exposed surface of the contact pads 213 and fill the recess 318 in the trace protection layer 102. The contact pads 213 recessed into the trace protection layer 102 can ensure a strong connection between the external connectors 104 and the contact pads 213 due to additional adhesion provided by contact with the sides of the trace protection layer 102 in the recess 318. A singulation step cutting through the encapsulation 212 and the trace protection layer 102 between particular groups of the contact pads 213 to separate individual packages can complete the manufacturing of the integrated circuit packaging system 100.

Figure 13:
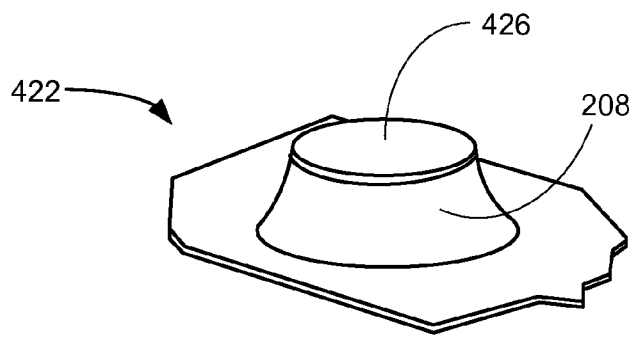
FIG. 13 is a detailed isometric view of FIG. 4 within the inset depicted by the dotted rectangle 13 of FIG. 4.

Referring now to FIG. 13, therein is shown a detailed isometric view of FIG. 4 within the inset depicted by the dotted rectangle 13 of FIG. 4. The detailed view is flipped in orientation from FIG. 4 and shows a portion of the pre-plated leadframe 422 having one of the contact protrusions 424 pre-plated with one of the protective pads 426. The one of the protective pads 426 is shown with a visible thickness for clarity, but it is understood that the protective pads 426 can be as thick or as thin as is necessary.

Figure 14:
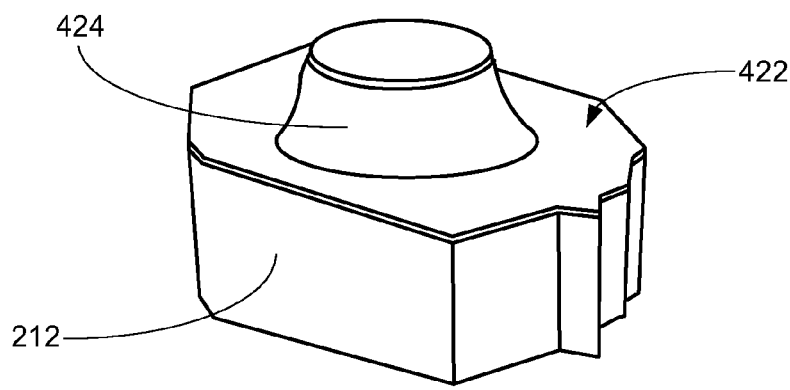
FIG. 14 is the structure of FIG. 13 in a first molding phase of manufacture.

Referring now to FIG. 14, therein is shown the structure of FIG. 13 in a first molding phase of manufacture. The integrated circuit die 208 of FIG. 2 can be attached and connected to the pre-plated leadframe 422, followed by the encapsulation 212 being applied to cover the integrated circuit die 208 and one side of the pre-plated leadframe 422, leaving the contact protrusions 424 exposed.

Figure 15:
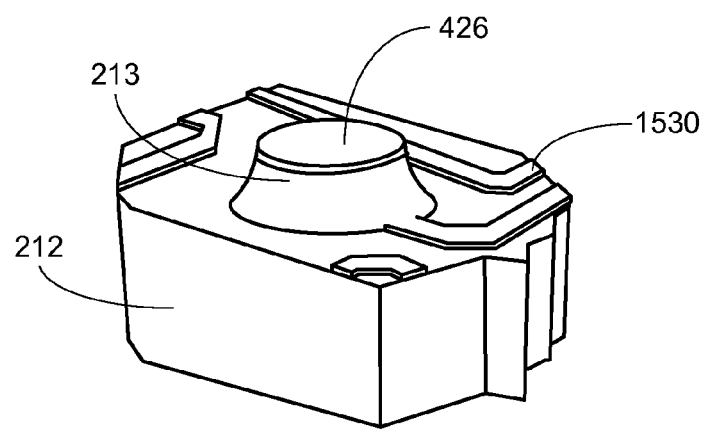
FIG. 15 is the structure of FIG. 14 in a first etching phase of manufacture.

Referring now to FIG. 15, therein is shown the structure of FIG. 14 in a first etching phase of manufacture. The pre-plated leadframe 422 of FIG. 13 can be masked and etched to remove material from the contact protrusions 424 of FIG. 13 to form the contact pads 213 while also forming traces 1530 for routing to and from the contact pads 213. The protective pads 426 on the contact protrusions 424 can prevent the etching process from decreasing the height of the contact protrusions 424 as material is removed to form the contact pads 213. The etching process can be controlled to stop etching as soon as the traces 1530 are fully formed on the encapsulation 212, and the mask (not shown) can then be removed.

Figure 16:
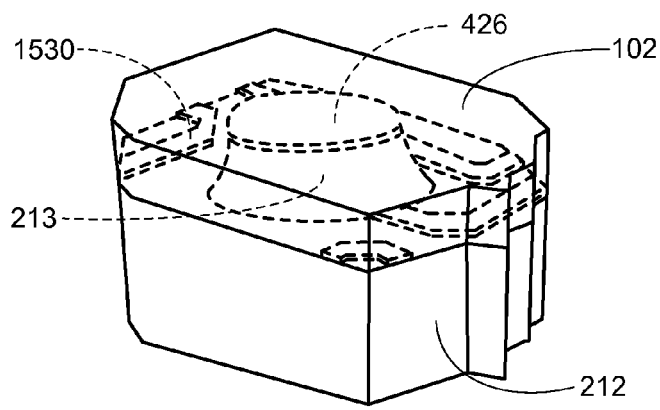
FIG. 16 is the structure of FIG. 15 in a second molding phase of manufacture.

Referring now to FIG. 16, therein is shown the structure of FIG. 15 in a second molding phase of manufacture. Following the formation of the traces 1530, the trace protection layer 102 can be applied to fully cover and directly contact the traces 1530, the contact pads 213, and the protective pads 426 on the contact pads 213. Features covered by the trace protection layer 102 are shown with dotted lines. Dotted lead lines are used to point to features that are not ordinarily visible. The trace protection layer 102 can be formed from the same material as the encapsulation 212 or from a different material. It is preferred for the purposes of preventing warpage and ease of manufacturing to use the same material as used to form the encapsulation 212.

It has been discovered that the use of the same material for the trace protection layer 102 as the encapsulation 212 helps prevent warpage issues in the completed package. Warpage of a package generally occurs due to differences in the coefficient of thermal expansion between different materials. When the trace protection layer 102 and the encapsulation 212 are made from the same material, their coefficients of thermal expansion are exactly matched, helping to prevent the package from warping. This can also help prevent delamination between the encapsulation 212 and the trace protection layer 102.

Figure 17A:
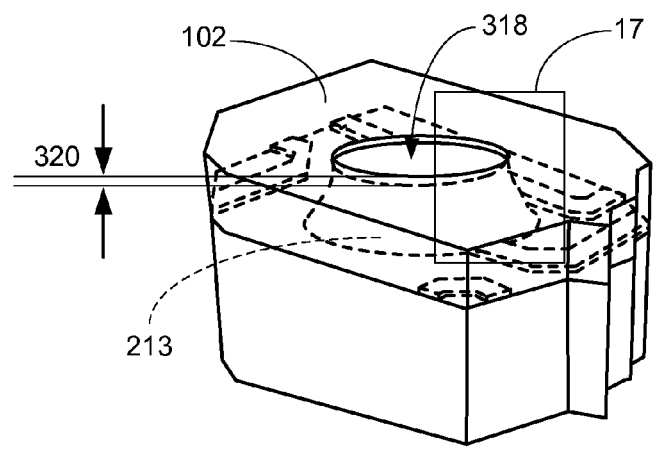
FIG. 17A is the structure of FIG. 16 in a second etching phase of manufacture.

Referring now to FIG. 17A, therein is shown the structure of FIG. 16 in a second etching phase of manufacture. After the application of the trace protection layer 102, a backgrinding step can be performed on the trace protection layer 102, also removing the protective pads 426 of FIG. 13 and a portion of the contact pads 213.

The backgrinding step is followed by a second etching step, which can remove the material of the contact pads 213 without removing the material of the trace protection layer 102 so as to form the recess 318 in the trace protection layer 102 wherein the top surface of the contact pads 213 is the bottom of the recess 318 and is the recess distance 320 below the top surface of the trace protection layer 102. The top surface of the contact pads 213 can also be called the external surface of the contact pads 213 because in this view, the orientation of the contact pads is inverted as compared to other figures showing the final product. In this example, the top surface of one of the contact pads 213 is shown as planar or flat, though it is understood that the top surface of the contact pads 213 can be concave or bowl-shaped due to an anisotropic etching method, with the central portion of the contact pads 213 lower than the outer edges. The etching process can leave the top surface of the contact pads 213 without defects.

Figure 17B:
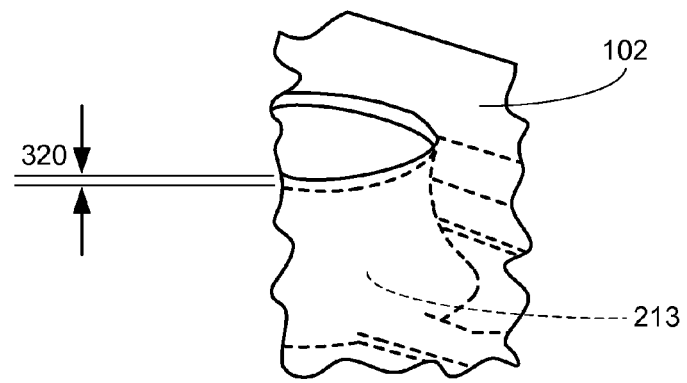
FIG. 17B is a detailed view of FIG. 17A within the inset depicted by the solid rectangle 17 of FIG. 17A.

Referring now to FIG. 17B, therein is shown a detailed view of FIG. 17A within the inset depicted by the solid rectangle 17 of FIG. 17A. In this view can clearly be seen one of the contact pads 213, the trace protection layer 102, and the recess distance 320 between them.

Figure 18:
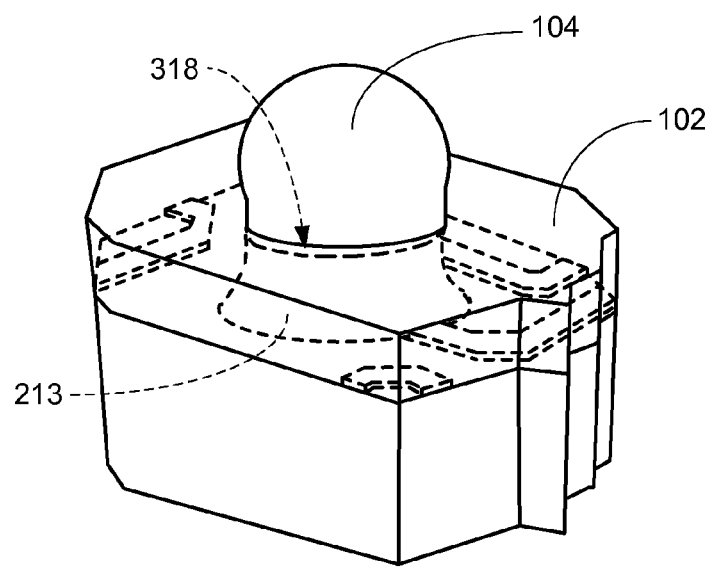
FIG. 18 is the structure of FIG. 17A in a ball attach phase of manufacture.

Referring now to FIG. 18, therein is shown the structure of FIG. 17A in a ball attach phase of manufacture. Following the second etching step to form the recess 318 in the trace protection layer 102, the external connectors 104 can be deposited directly in the recess 318, directly on the contact pads 213, and without using a solder-wettable plating layer. This can be followed by a reflow step where the external connectors 104, such as solder balls, are reflowed to fully cover the exposed surface of the contact pads 213 and fill the recess 318 in the trace protection layer 102. The contact pads 213 being recessed into the trace protection layer 102 can ensure a strong connection is maintained between the external connectors 104 and the contact pads 213.

Figure 19A:
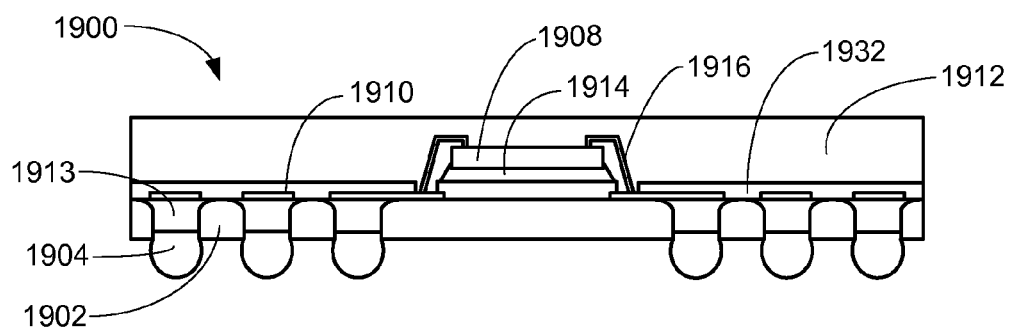
FIG. 19A is a cross-sectional view of the integrated circuit packaging system as exemplified by the bottom view of FIG. 1 and along the section line 2-2 of FIG. 1 in a second embodiment of the present invention.

Referring now to FIG. 19A, therein is shown a cross-sectional view of the integrated circuit packaging system 1900 as exemplified by the bottom view of FIG. 1 and along the section line 2-2 of FIG. 1 in a second embodiment of the present invention. The cross-sectional view shows an integrated circuit die 1908, bond structures 1910, an encapsulation 1912, contact pads 1913, a solder resist layer 1932, a trace protection layer 1902, and external connectors 1904. The integrated circuit die 1908, such as a wire-bond die or a flip chip die, can be mounted to the solder resist layer 1932 using a die attach adhesive 1914. The die attach adhesive 1914 can contact the bottom and a portion of the sides of the integrated circuit die 1908. The solder resist layer 1932 can function to improve reliability of the package by covering traces and internal contact points and preventing electrical shorts between them.

The trace protection layer 1902 protects and holds traces and contacts in place, and can be made from a material such as epoxy molding compound, resin, moldable underfill, a curable compound, or other non-conductive material. The trace protection layer 1902 is located under the integrated circuit die 1908 and in contact with the solder resist layer 1932. The traces 1530 of FIG. 15 are not shown in this figure, but the traces 1530 are covered by the trace protection layer 1902 and route connections to and from the contact pads 1913.

The solder resist layer 1932 can extend to the edges of the integrated circuit packaging system 1900 over and in contact with the contact pads 1913. For example, the contact pads 1913 can be made from a conductive material such as copper or a copper alloy. The contact pads 1913 can have partially curved sides as a result of an etching process. The contact pads 1913 are in direct contact with the external connectors 1904 on a bottom surface and in direct contact with the bond structures 1910 on a top surface, which can be planar.

The external connectors 1904, such as solder balls, can be connected to the contact pads 1913 through the trace protection layer 1902. The external connectors 1904 function to electrically connect the integrated circuit die 1908 to the outside of the integrated circuit packaging system 1900. The external connectors 1904 can be arranged in a staggered, regular, or irregular array, for example.

The bond structures 1910 can route electrical signals from the integrated circuit die 1908 to the contact pads 1913 directly or through traces. The bond structures 1910 can be made of conductive material such as gold, silver, nickel, palladium, tungsten, other metals, or a combination thereof. The integrated circuit die 1908 is connected to the bond structures 1910 and further to the contact pads 1913 and the external connectors 104 through internal interconnects 1916, such as bond wires, solder balls, conductive posts, or conductive columns. The bond structures 1910 are covered by the solder resist layer 1932 except at points where the internal interconnects 1916 connect to the bond structures 1910.

The encapsulation 1912 directly contacts the integrated circuit die 1908, the solder resist layer 1932, and the internal interconnects 1916. The encapsulation 1912 is separated from the trace protection layer 1902 by the solder resist layer 1932. The encapsulation 1912 can be made from the same kinds of material as the trace protection layer 1902.

The contact pads 1913 are recessed into the trace protection layer 1902, such as a second encapsulation layer, and the external connectors 104 directly contact the material of the contact pads 1913 without intervening plating. The external connectors 104 also directly contact the trace protection layer 1902, creating a stronger solder joint.

Figure 19B:
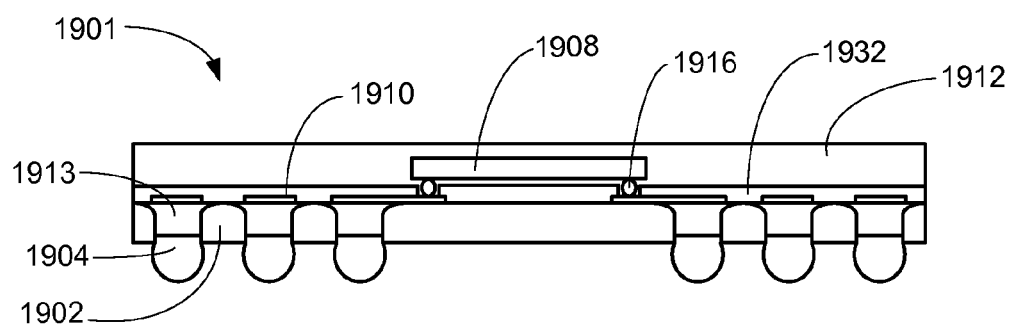
FIG. 19B is a cross-sectional view of the integrated circuit packaging system as exemplified by the bottom view of FIG. 1 and along the section line 2-2 of FIG. 1 in a third embodiment of the present invention.

Referring now to FIG. 19B, therein is shown a cross-sectional view of the integrated circuit packaging system 1901 as exemplified by the bottom view of FIG. 1 and along the section line 2-2 of FIG. 1 in a third embodiment of the present invention. The cross-sectional view shows the integrated circuit die 1908, the bond structures 1910, the encapsulation 1912, the contact pads 1913, the solder resist layer 1932, the trace protection layer 1902, and the external connectors 1904. The integrated circuit die 1908, such as a wire-bond die or a flip chip die, can be mounted above the solder resist layer 1932. The solder resist layer 1932 can function to improve reliability of the package by covering traces and internal contact points and preventing electrical shorts between them.

The trace protection layer 1902 protects and holds traces and contacts in place, and can be made from a material such as epoxy molding compound, resin, moldable underfill, a curable compound, or other non-conductive material. The trace protection layer 1902 is located under the integrated circuit die 1908 and in contact with the solder resist layer 1932. The traces 1530 of FIG. 15 are not shown in this figure, but the traces 1530 are covered by the trace protection layer 1902 and route connections to and from the contact pads 1913.

The solder resist layer 1932 can extend to the edges of the integrated circuit packaging system 1900 over and in contact with the contact pads 1913. For example, the contact pads 1913 can be made from a conductive material such as copper or a copper alloy. The contact pads 1913 can have partially curved sides as a result of an etching process. The contact pads 1913 are in direct contact with the external connectors 1904 on a bottom surface and in direct contact with the bond structures 1910 on a top surface. The bond structures 1910 can be planar.

The external connectors 1904, such as solder balls, can be connected to the contact pads 1913 through the trace protection layer 1902. The external connectors 1904 function to electrically connect the integrated circuit die 1908 to the outside of the integrated circuit packaging system 1901. The external connectors 1904 can be arranged in a staggered, regular, or irregular array, for example.

The bond structures 1910 can route electrical signals from the integrated circuit die 1908 to the contact pads 1913 directly or through traces. The bond structures 1910 can be made of conductive material such as gold, silver, nickel, palladium, tungsten, other metals, or a combination thereof. The integrated circuit die 1908 is connected to the bond structures 1910 and further to the contact pads 1913 and the external connectors 104 through the internal interconnects 1916, such as bond wires, solder balls, conductive posts, or conductive columns. The bond structures 1910 are covered by the solder resist layer 1932 except at points where the internal interconnects 1916 connect to the bond structures 1910.

The encapsulation 1912 directly contacts the integrated circuit die 1908, the solder resist layer 1932, and the internal interconnects 1916. The encapsulation 1912 is separated from the trace protection layer 1902 by the solder resist layer 1932. The encapsulation 1912 can be made from the same kind of material as the trace protection layer 1902.

The contact pads 1913 are recessed into the trace protection layer 1902, such as a second encapsulation layer, and the external connectors 104 directly contact the material of the contact pads 1913 without intervening plating. The external connectors 104 also directly contact the trace protection layer 1902, creating a stronger solder joint.

Figure 20A:
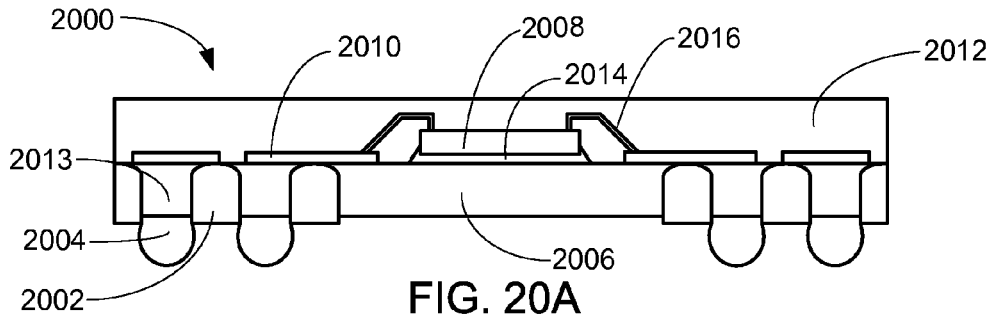
FIG. 20A is a cross-sectional view of the integrated circuit packaging system as exemplified by the bottom view of FIG. 1 and along the section line 2-2 of FIG. 1 in a fourth embodiment of the present invention.

Referring now to FIG. 20A, therein is shown a cross-sectional view of the integrated circuit packaging system 2000 as exemplified by the bottom view of FIG. 1 and along the section line 2-2 of FIG. 1 in a fourth embodiment of the present invention. The cross-sectional view shows an integrated circuit die 2008, bond structures 2010, an encapsulation 2012, contact pads 2013, a die paddle 2006, a trace protection layer 2002, and external connectors 2004. The integrated circuit die 2008, such as a wire-bond die or a flip chip die, can be mounted to the die paddle 2006 using a die attach adhesive 2014. The die attach adhesive 2014 can contact the bottom and a portion of the sides of the integrated circuit die 2008. The die paddle 2006 can function to dissipate heat or to provide a path to ground for the integrated circuit die 2008.

The trace protection layer 2002 protects and holds traces and contacts in place, and can be made from a material such as epoxy molding compound, resin, moldable underfill, a curable compound, or other non-conductive material. The trace protection layer 2002 is shown as opaque, but it is understood that a translucent or transparent material may be used. The traces 1530 of FIG. 15 are not shown in this figure, but the traces 1530 are covered by the trace protection layer 2002 and route connections to and from the contact pads 2013.

The die paddle 2006 can be laterally surrounded by the contact pads 2013, which are made from the same material as the die paddle 2006. For example, the die paddle 2006 and the contact pads 2013 can be made from a conductive material such as copper or a copper alloy. The die paddle 2006 and the contact pads 2013 can have partially curved sides as a result of an etching process. The contact pads 2013 are in direct contact with the external connectors 2004 on a bottom surface and in direct contact with the bond structures 2010 on a top surface. The bond structures 2010 can be planar.

The external connectors 2004, such as solder balls, can be connected to the contact pads 2013 through the trace protection layer 2002. The external connectors 2004 function to electrically connect the integrated circuit die 2008 to the outside of the integrated circuit packaging system 2000. The external connectors 2004 can be arranged in a staggered, regular, or irregular array, for example.

The bond structures 2010 can route electrical signals from the integrated circuit die 2008 to the contact pads 2013 directly or through traces. The bond structures 2010 can be made of conductive material such as gold, silver, nickel, palladium, tungsten, other metals, or a combination thereof. The integrated circuit die 2008 is connected to the bond structures 2010 and further to the contact pads 2013 and the external connectors 104 through internal interconnects 2016, such as bond wires, solder balls, conductive posts, or conductive columns.

The encapsulation 2012 directly contacts the integrated circuit die 2008, the bond structures 2010, and the internal interconnects 2016. The encapsulation 2012 also is in direct contact with portions of the trace protection layer 2002 between the contact pads 2013. The encapsulation 2012 can be made from a material such as epoxy molding compound, curable underfill, or other moldable compound.

The contact pads 2013 and the die paddle 2006 are recessed into the trace protection layer 2002, such as a second encapsulation layer, and the external connectors 104 directly contact the material of the contact pads 2013 without intervening plating. The external connectors 104 also directly contact the trace protection layer 2002, creating a stronger solder joint.

Figure 20B:
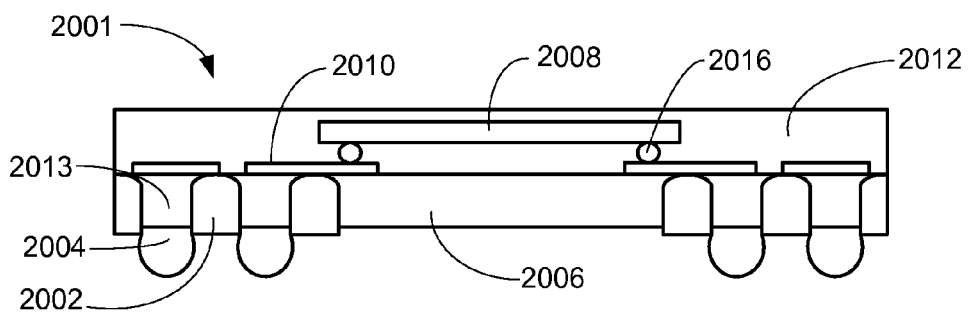
FIG. 20B is a cross-sectional view of the integrated circuit packaging system as exemplified by the bottom view of FIG. 1 and along the section line 2-2 of FIG. 1 in a fifth embodiment of the present invention.

Referring now to FIG. 20B, therein is shown a cross-sectional view of the integrated circuit packaging system 2001 as exemplified by the bottom view of FIG. 1 and along the section line 2-2 of FIG. 1 in a fifth embodiment of the present invention. The cross-sectional view shows the integrated circuit die 2008, the bond structures 2010, the encapsulation 2012, the contact pads 2013, the die paddle 2006, the trace protection layer 2002, and the external connectors 2004. The integrated circuit die 2008, such as a wire-bond die or a flip chip die, can be mounted above the die paddle 2006. The die paddle 2006 can function to dissipate heat or to provide a path to ground for the integrated circuit die 2008.

The trace protection layer 2002 protects and holds traces and contacts in place, and can be made from a material such as epoxy molding compound, resin, moldable underfill, a curable compound, or other non-conductive material. The trace protection layer 2002 is shown as opaque, but it is understood that a translucent or transparent material may be used. The traces 1530 of FIG. 15 are not shown in this figure, but the traces 1530 are covered by the trace protection layer 2002 and route connections to and from the contact pads 2013.

The die paddle 2006 can be laterally surrounded by the contact pads 2013, which are made from the same material as the die paddle 2006. For example, the die paddle 2006 and the contact pads 2013 can be made from a conductive material such as copper or a copper alloy. The die paddle 2006 and the contact pads 2013 can have partially curved sides as a result of an etching process. The contact pads 2013 are in direct contact with the external connectors 2004 on a bottom surface and in direct contact with the bond structures 2010 on a top surface. The bond structures 2010 can be planar.

The external connectors 2004, such as solder balls, can be connected to the contact pads 2013 through the trace protection layer 2002. The external connectors 2004 function to electrically connect the integrated circuit die 2008 to the outside of the integrated circuit packaging system 2000. The external connectors 2004 can be arranged in a staggered, regular, or irregular array, for example.

The bond structures 2010 can route electrical signals from the integrated circuit die 2008 to the contact pads 2013 directly or through traces. The bond structures 2010 can be made of conductive material such as gold, silver, nickel, palladium, tungsten, other metals, or a combination thereof. The integrated circuit die 2008 is connected to the bond structures 2010 and further to the contact pads 2013 and the external connectors 104 through the internal interconnects 2016, such as bond wires, solder balls, conductive posts, or conductive columns.

The encapsulation 2012 directly contacts the integrated circuit die 2008, the bond structures 2010, and the internal interconnects 2016. The encapsulation 2012 also is in direct contact with portions of the trace protection layer 2002 between the contact pads 2013. The encapsulation 2012 can be made from a material such as epoxy molding compound, curable underfill, or other moldable compound.

The contact pads 2013 and the die paddle 2006 are recessed into the trace protection layer 2002, such as a second encapsulation layer, and the external connectors 104 directly contact the material of the contact pads 2013 without intervening plating. The external connectors 104 also directly contact the trace protection layer 2002, creating a stronger solder joint.

Figure 21A:
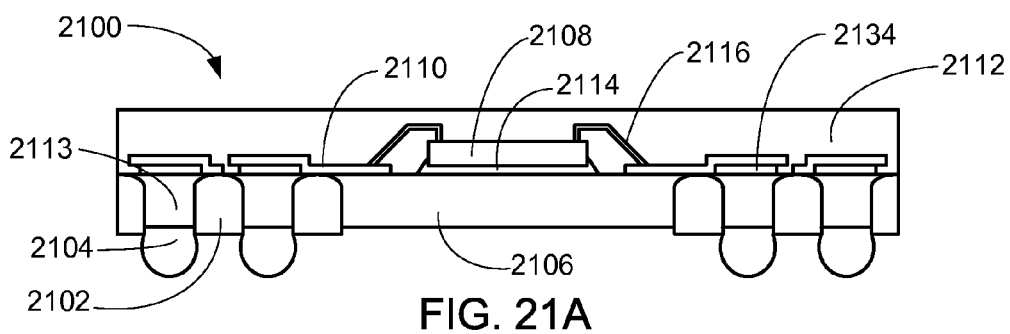
FIG. 21A is a cross-sectional view of the integrated circuit packaging system as exemplified by the bottom view of FIG. 1 and along the section line 2-2 of FIG. 1 in a sixth embodiment of the present invention.

Referring now to FIG. 21A, therein is shown a cross-sectional view of the integrated circuit packaging system 2100 as exemplified by the bottom view of FIG. 1 and along the section line 2-2 of FIG. 1 in a sixth embodiment of the present invention. The cross-sectional view shows an integrated circuit die 2108, bond structures 2110, an encapsulation 2112, contact pads 2113, a die paddle 2106, a trace protection layer 2102, and external connectors 2104. The integrated circuit die 2108, such as a wire-bond die or a flip chip die, can be mounted to the die paddle 2106 using a die attach adhesive 2114. The die attach adhesive 2114 can contact the bottom and a portion of the sides of the integrated circuit die 2108. The die paddle 2106 can function to dissipate heat or to provide a path to ground for the integrated circuit die 2108.

The trace protection layer 2102 protects and holds traces and contacts in place, and can be made from a material such as epoxy molding compound, resin, moldable underfill, a curable compound, or other non-conductive material. The trace protection layer 2102 is shown as opaque, but it is understood that a translucent or transparent material may be used. The traces 1530 of FIG. 15 are not shown in this figure, but the traces 1530 are covered by the trace protection layer 2102 and route connections to and from the contact pads 2113.

The die paddle 2106 can be laterally surrounded by the contact pads 2113, which are made from the same material as the die paddle 2106. For example, the die paddle 2106 and the contact pads 2113 can be made from a conductive material such as copper or a copper alloy. The die paddle 2106 and the contact pads 2113 can have partially curved sides as a result of an etching process. The contact pads 2113 are in direct contact with the external connectors 2104 on a bottom surface and in direct contact with a contact cap 2134 on a top surface. The bond structures 2110 can follow the contour of the combination of the contact pads 2113, the die paddle 2106, and the contact cap 2134 on the top surface of the contact pads 2113. The contact cap 2134 can function to increase reliability by allowing for an overhang of the bond structures 2110, which can help mold locking along with slightly decreasing bond distances.

The external connectors 2104, such as solder balls, can be connected to the contact pads 2113 through the trace protection layer 2102. The external connectors 2104 function to electrically connect the integrated circuit die 2108 to the outside of the integrated circuit packaging system 2100. The external connectors 2104 can be arranged in a staggered, regular, or irregular array, for example.

The bond structures 2110 can route electrical signals from the integrated circuit die 2108 to the contact pads 2113 directly or through traces. The bond structures 2110 can be made of conductive material such as gold, silver, nickel, palladium, tungsten, other metals, or a combination thereof. The integrated circuit die 2108 is connected to the bond structures 2110 and further to the contact pads 2113 and the external connectors 2104 through internal interconnects 2116, such as bond wires, solder balls, conductive posts, or conductive columns.

The encapsulation 2112 directly contacts the integrated circuit die 2108, the bond structures 2110, and the internal interconnects 2116. The encapsulation 2112 also is in direct contact with portions of the trace protection layer 2102 between the contact pads 2113. The encapsulation 2112 can be made from a material such as epoxy molding compound, curable underfill, or other moldable compound.

The contact pads 2113 and the die paddle 2106 are recessed into the trace protection layer 2102, such as a second encapsulation layer, and the external connectors 104 directly contact the material of the contact pads 2113 without intervening plating. The external connectors 2104 also directly contact the trace protection layer 2102, creating a stronger solder joint.

Figure 21B:
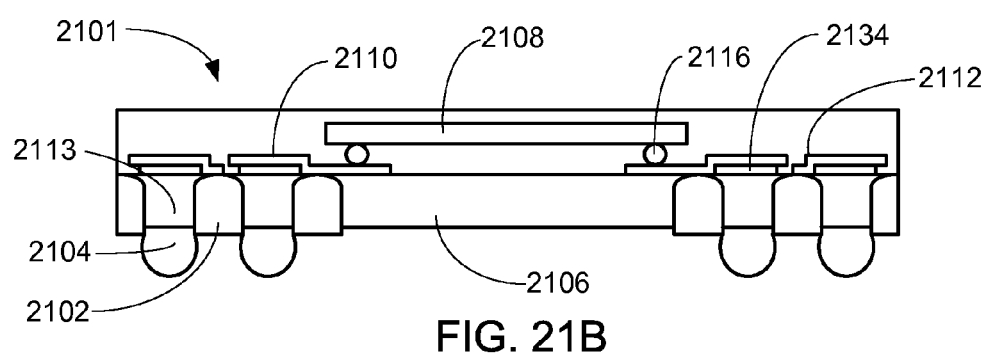
FIG. 21B is a cross-sectional view of the integrated circuit packaging system as exemplified by the bottom view of FIG. 1 and along the section line 2-2 of FIG. 1 in a seventh embodiment of the present invention.

Referring now to FIG. 21B, therein is shown a cross-sectional view of the integrated circuit packaging system 2101 as exemplified by the bottom view of FIG. 1 and along the section line 2-2 of FIG. 1 in a seventh embodiment of the present invention. The cross-sectional view shows the integrated circuit die 2108, the bond structures 2110, the encapsulation 2112, the contact pads 2113, the die paddle 2106, the trace protection layer 2102, and the external connectors 2104. The integrated circuit die 2108, such as a wire-bond die or a flip chip die, can be mounted to the die paddle 2106 using the die attach adhesive 2114. The die attach adhesive 2114 can contact the bottom and a portion of the sides of the integrated circuit die 2108. The die paddle 2106 can function to dissipate heat or to provide a path to ground for the integrated circuit die 2108.

The trace protection layer 2102 protects and holds traces and contacts in place, and can be made from a material such as epoxy molding compound, resin, moldable underfill, a curable compound, or other non-conductive material. The trace protection layer 2102 is shown as opaque, but it is understood that a translucent or transparent material may be used. The traces 1530 of FIG. 15 are not shown in this figure, but the traces 1530 are covered by the trace protection layer 2102 and route connections to and from the contact pads 2113.

The die paddle 2106 can be laterally surrounded by the contact pads 2113, which are made from the same material as the die paddle 2106. For example, the die paddle 2106 and the contact pads 2113 can be made from a conductive material such as copper or a copper alloy. The die paddle 2106 and the contact pads 2113 can have partially curved sides as a result of an etching process. The contact pads 2113 are in direct contact with the external connectors 2104 on a bottom surface and in direct contact with the contact cap 2134 on a top surface. The bond structures 2110 can follow the contour of the combination of the contact pads 2113, the die paddle 2106, and the contact cap 2134 on the top surface of the contact pads 2113. The contact cap 2134 can function to increase reliability by allowing for an overhang of the bond structures 2110, which can help mold locking.

The external connectors 2104, such as solder balls, can be connected to the contact pads 2113 through the trace protection layer 2102. The external connectors 2104 function to electrically connect the integrated circuit die 2108 to the outside of the integrated circuit packaging system 2100. The external connectors 2104 can be arranged in a staggered, regular, or irregular array, for example.

The bond structures 2110 can route electrical signals from the integrated circuit die 2108 to the contact pads 2113 directly or through traces. The bond structures 2110 can be made of conductive material such as gold, silver, nickel, palladium, tungsten, other metals, or a combination thereof. The integrated circuit die 2108 is connected to the bond structures 2110 and further to the contact pads 2113 and the external connectors 104 through the internal interconnects 2116, such as bond wires, solder balls, conductive posts, or conductive columns.

The encapsulation 2112 directly contacts the integrated circuit die 2108, the bond structures 2110, and the internal interconnects 2116. The encapsulation 2112 also is in direct contact with portions of the trace protection layer 2102 between the contact pads 2113. The encapsulation 2112 can be made from a material such as epoxy molding compound, curable underfill, or other moldable compound.

The contact pads 2113 and the die paddle 2106 are recessed into the trace protection layer 2102, such as a second encapsulation layer, and the external connectors 104 directly contact the material of the contact pads 2113 without intervening plating. The external connectors 104 also directly contact the trace protection layer 2102, creating a stronger solder joint.

Figure 22A:
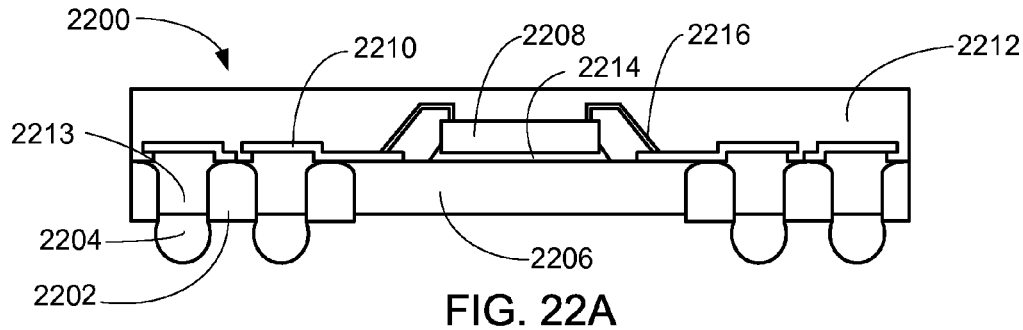
FIG. 22A is a cross-sectional view of the integrated circuit packaging system as exemplified by the bottom view of FIG. 1 and along the section line 2-2 of FIG. 1 in an eighth embodiment of the present invention.

Referring now to FIG. 22A, therein is shown a cross-sectional view of the integrated circuit packaging system 2200 as exemplified by the bottom view of FIG. 1 and along the section line 2-2 of FIG. 1 in an eighth embodiment of the present invention. The cross-sectional view shows an integrated circuit die 2208, bond structures 2210, an encapsulation 2212, contact pads 2213, a die paddle 2206, a trace protection layer 2202, and external connectors 2204. The integrated circuit die 2208, such as a wire-bond die or a flip chip die, can be mounted to the die paddle 2206 using a die attach adhesive 2214. The die attach adhesive 2214 can contact the bottom and a portion of the sides of the integrated circuit die 2208. The die paddle 2206 can function to dissipate heat or to provide a path to ground for the integrated circuit die 2208.

The trace protection layer 2202 protects and holds traces and contacts in place, and can be made from a material such as epoxy molding compound, resin, moldable underfill, a curable compound, or other non-conductive material. The trace protection layer 2202 is shown as opaque, but it is understood that a translucent or transparent material may be used. The traces 1530 of FIG. 15 are not shown in this figure, but the traces 1530 are covered by the trace protection layer 2202 and route connections to and from the contact pads 2213.

The die paddle 2206 can be laterally surrounded by the contact pads 2213, which are made from the same material as the die paddle 2206. For example, the die paddle 2206 and the contact pads 2213 can be made from a conductive material such as copper or a copper alloy. The die paddle 2206 and the contact pads 2213 can have partially curved sides as a result of an etching process. The contact pads 2213 are in direct contact with the external connectors 2204 on a bottom surface and have a top surface which is partially etched to give a stepped structure. The bond structures 2210 can follow the contours of the stepped upper surface of the contact pads 2213, and can overhang the contact pads 2213 to function to increase mold lock, increasing reliability.

The external connectors 2204, such as solder balls, can be connected to the contact pads 2213 through the trace protection layer 2202. The external connectors 2204 function to electrically connect the integrated circuit die 2208 to the outside of the integrated circuit packaging system 2200. The external connectors 2204 can be arranged in a staggered, regular, or irregular array, for example.

The bond structures 2210 can route electrical signals from the integrated circuit die 2208 to the contact pads 2213 directly or through traces. The bond structures 2210 can be made of conductive material such as gold, silver, nickel, palladium, tungsten, other metals, or a combination thereof. The integrated circuit die 2208 is connected to the bond structures 2210 and further to the contact pads 2213 and the external connectors 104 through internal interconnects 2216, such as bond wires, solder balls, conductive posts, or conductive columns.

The encapsulation 2212 directly contacts the integrated circuit die 2208, the bond structures 2210, and the internal interconnects 2216. The encapsulation 2212 also is in direct contact with portions of the trace protection layer 2202 between the contact pads 2213. The encapsulation 2212 can be made from a material such as epoxy molding compound, curable underfill, or other moldable compound.

The contact pads 2213 and the die paddle 2206 are recessed into the trace protection layer 2202, such as a second encapsulation layer, and the external connectors 104 directly contact the material of the contact pads 2213 without intervening plating. The external connectors 104 also directly contact the trace protection layer 2202, creating a stronger solder joint.

Figure 22B:
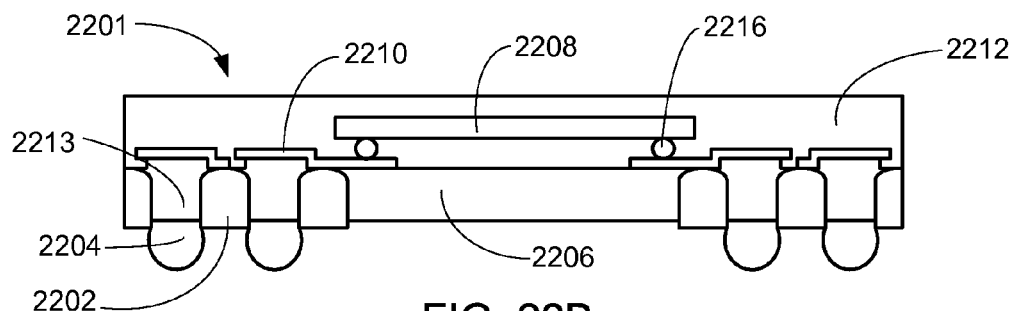
FIG. 22B is a cross-sectional view of the integrated circuit packaging system as exemplified by the bottom view of FIG. 1 and along the section line 2-2 of FIG. 1 in a ninth embodiment of the present invention.

Referring now to FIG. 22B, therein is shown a cross-sectional view of the integrated circuit packaging system 2201 as exemplified by the bottom view of FIG. 1 and along the section line 2-2 of FIG. 1 in a ninth embodiment of the present invention. The cross-sectional view shows the integrated circuit die 2208, the bond structures 2210, the encapsulation 2212, the contact pads 2213, the die paddle 2206, the trace protection layer 2202, and the external connectors 2204. The integrated circuit die 2208, such as a wire-bond die or a flip chip die, can be mounted above the die paddle 2206. The die paddle 2206 can function to dissipate heat or to provide a path to ground for the integrated circuit die 2208.

The trace protection layer 2202 protects and holds traces and contacts in place, and can be made from a material such as epoxy molding compound, resin, moldable underfill, a curable compound, or other non-conductive material. The trace protection layer 2202 is shown as opaque, but it is understood that a translucent or transparent material may be used. The traces 1530 of FIG. 15 are not shown in this figure, but the traces 1530 are covered by the trace protection layer 2202 and route connections to and from the contact pads 2213.

The die paddle 2206 can be laterally surrounded by the contact pads 2213, which are made from the same material as the die paddle 2206. For example, the die paddle 2206 and the contact pads 2213 can be made from a conductive material such as copper or a copper alloy. The die paddle 2206 and the contact pads 2213 can have partially curved sides as a result of an etching process. The contact pads 2213 are in direct contact with the external connectors 2204 on a bottom surface and have a top surface which is partially etched to give a stepped structure. The bond structures 2210 can follow the contours of the stepped upper surface of the contact pads 2213, and can overhang the contact pads 2213 to function to increase mold lock, increasing reliability.

The external connectors 2204, such as solder balls, can be connected to the contact pads 2213 through the trace protection layer 2202. The external connectors 2204 function to electrically connect the integrated circuit die 2208 to the outside of the integrated circuit packaging system 2200. The external connectors 2204 can be arranged in a staggered, regular, or irregular array, for example.

The bond structures 2210 can route electrical signals from the integrated circuit die 2208 to the contact pads 2213 directly or through traces. The bond structures 2210 can be made of conductive material such as gold, silver, nickel, palladium, tungsten, other metals, or a combination thereof. The integrated circuit die 2208 is connected to the bond structures 2210 and further to the contact pads 2213 and the external connectors 104 through the internal interconnects 2216, such as bond wires, solder balls, conductive posts, or conductive columns.

The encapsulation 2212 directly contacts the integrated circuit die 2208, the bond structures 2210, and the internal interconnects 2216. The encapsulation 2212 also is in direct contact with portions of the trace protection layer 2202 between the contact pads 2213. The encapsulation 2212 can be made from a material such as epoxy molding compound, curable underfill, or other moldable compound.

The contact pads 2213 and the die paddle 2206 are recessed into the trace protection layer 2202, such as a second encapsulation layer, and the external connectors 104 directly contact the material of the contact pads 2213 without intervening plating. The external connectors 104 also directly contact the trace protection layer 2202, creating a stronger solder joint.

Figure 23A:
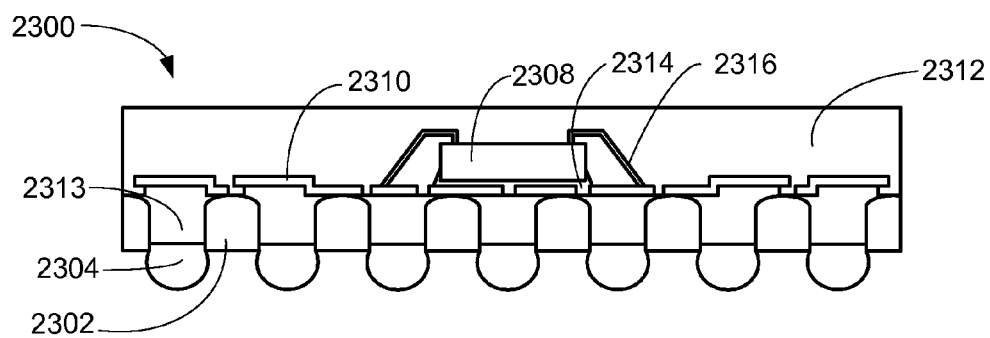
FIG. 23A is a cross-sectional view of the integrated circuit packaging system as exemplified by the bottom view of FIG. 1 and along the section line 2-2 of FIG. 1 in a tenth embodiment of the present invention.

Referring now to FIG. 23A, therein is shown a cross-sectional view of the integrated circuit packaging system 2300 as exemplified by the bottom view of FIG. 1 and along the section line 2-2 of FIG. 1 in a tenth embodiment of the present invention. The cross-sectional view shows an integrated circuit die 2308, bond structures 2310, an encapsulation 2312, contact pads 2313, a trace protection layer 2302, and external connectors 2304. The integrated circuit die 2308, such as a wire-bond die or a flip chip die, can be mounted to the contact pads 2313 which are centrally located using a die attach adhesive 2314. The die attach adhesive 2314 can contact the bottom and a portion of the sides of the integrated circuit die 2308.

The trace protection layer 2302 protects and holds traces and contacts in place, and can be made from a material such as epoxy molding compound, resin, moldable underfill, a curable compound, or other non-conductive material. The trace protection layer 2302 is shown as opaque, but it is understood that a translucent or transparent material may be used. The traces 1530 of FIG. 15 are not shown in this figure, but the traces 1530 are covered by the trace protection layer 2302 and route connections to and from the contact pads 2313.

For example, the contact pads 2313 can be made from a conductive material such as copper or a copper alloy. The contact pads 2313 can have partially curved sides as a result of an etching process. The contact pads 2313 are in direct contact with the external connectors 2304 on a bottom surface and can either have a flat top surface or a top surface which is partially etched to give a stepped structure. The bond structures 2310 can follow the contours of the stepped upper surface of the contact pads 2313, and can overhang the contact pads 2313 to function to increase mold lock, increasing reliability. The contact pads 2313 can be arranged in a full array, with no die paddle present, simplifying manufacturing.

The external connectors 2304, such as solder balls, can be connected to the contact pads 2313 through the trace protection layer 2302. The external connectors 2304 function to electrically connect the integrated circuit die 2308 to the outside of the integrated circuit packaging system 2300. The external connectors 2304 can be arranged in a staggered, regular, or irregular array, for example.

The bond structures 2310 can route electrical signals from the integrated circuit die 2308 to the contact pads 2313 directly or through traces. The bond structures 2310 can be made of conductive material such as gold, silver, nickel, palladium, tungsten, other metals, or a combination thereof. The integrated circuit die 2308 is connected to the bond structures 2310 and further to the contact pads 2313 and the external connectors 104 through internal interconnects 2316, such as bond wires, solder balls, conductive posts, or conductive columns.

The encapsulation 2312 directly contacts the integrated circuit die 2308, the bond structures 2310, and the internal interconnects 2316. The encapsulation 2312 also is in direct contact with portions of the trace protection layer 2302 between the contact pads 2313. The encapsulation 2312 can be made from a material such as epoxy molding compound, curable underfill, or other moldable compound.

The contact pads 2313 are recessed into the trace protection layer 2302, such as a second encapsulation layer, and the external connectors 104 directly contact the material of the contact pads 2313 without intervening plating. The external connectors 104 also directly contact the trace protection layer 2302, creating a stronger solder joint.

Figure 23B:
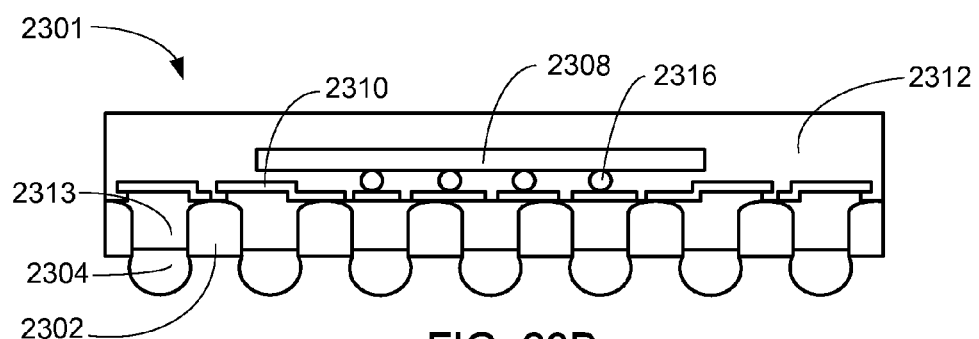
FIG. 23B is a cross-sectional view of the integrated circuit packaging system as exemplified by the bottom view of FIG. 1 and along the section line 2-2 of FIG. 1 in an eleventh embodiment of the present invention.

Referring now to FIG. 23B, therein is shown a cross-sectional view of the integrated circuit packaging system 2301 as exemplified by the bottom view of FIG. 1 and along the section line 2-2 of FIG. 1 in an eleventh embodiment of the present invention. The cross-sectional view shows the integrated circuit die 2308, the bond structures 2310, the encapsulation 2312, the contact pads 2313, the trace protection layer 2302, and the external connectors 2304. The integrated circuit die 2308, such as a wire-bond die or a flip chip die, can be mounted over the contact pads 2313 which are centrally located.

The trace protection layer 2302 protects and holds traces and contacts in place, and can be made from a material such as epoxy molding compound, resin, moldable underfill, a curable compound, or other non-conductive material. The trace protection layer 2302 is shown as opaque, but it is understood that a translucent or transparent material may be used. The traces 1530 of FIG. 15 are not shown in this figure, but the traces 1530 are covered by the trace protection layer 2302 and route connections to and from the contact pads 2313.

For example, the contact pads 2313 can be made from a conductive material such as copper or a copper alloy. The contact pads 2313 can have partially curved sides as a result of an etching process. The contact pads 2313 are in direct contact with the external connectors 2304 on a bottom surface and can either have a flat top surface or a top surface which is partially etched to give a stepped structure. The bond structures 2310 can follow the contours of the stepped upper surface of the contact pads 2313, and can overhang the contact pads 2313 to function to increase mold lock, increasing reliability. The contact pads 2313 can be arranged in a full array, with no die paddle present, simplifying manufacturing.

The external connectors 2304, such as solder balls, can be connected to the contact pads 2313 through the trace protection layer 2302. The external connectors 2304 function to electrically connect the integrated circuit die 2308 to the outside of the integrated circuit packaging system 2300. The external connectors 2304 can be arranged in a staggered, regular, or irregular array, for example.

The bond structures 2310 can route electrical signals from the integrated circuit die 2308 to the contact pads 2313 directly or through traces. The bond structures 2310 can be made of conductive material such as gold, silver, nickel, palladium, tungsten, other metals, or a combination thereof. The integrated circuit die 2308 is connected to the bond structures 2310 and further to the contact pads 2313 and the external connectors 104 through the internal interconnects 2316, such as bond wires, solder balls, conductive posts, or conductive columns.

The encapsulation 2312 directly contacts the integrated circuit die 2308, the bond structures 2310, and the internal interconnects 2316. The encapsulation 2312 also is in direct contact with portions of the trace protection layer 2302 between the contact pads 2313. The encapsulation 2312 can be made from a material such as epoxy molding compound, curable underfill, or other moldable compound.

The contact pads 2313 are recessed into the trace protection layer 2302, such as a second encapsulation layer, and the external connectors 104 directly contact the material of the contact pads 2313 without intervening plating. The external connectors 104 also directly contact the trace protection layer 2302, creating a stronger solder joint.

Figure 24:
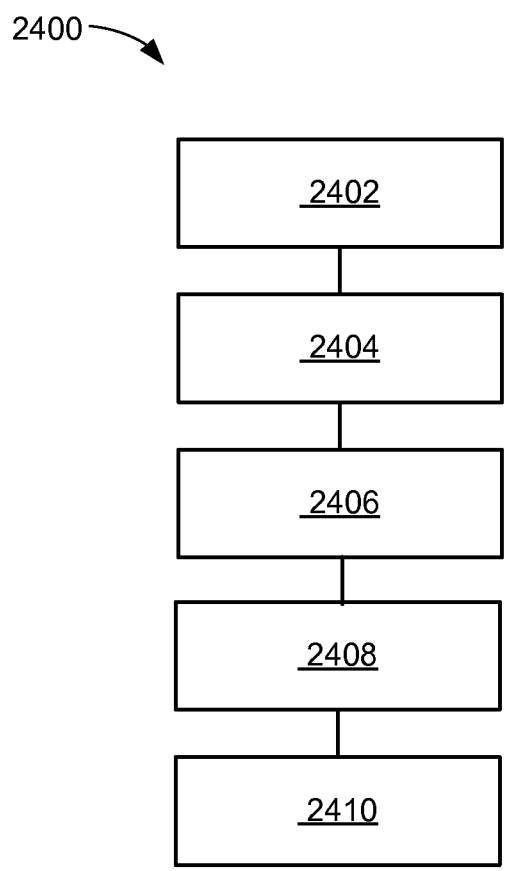
FIG. 24 is a flow chart of a method of manufacture of the integrated circuit packaging system in a further embodiment of the present invention.

Referring now to FIG. 24, therein is shown a flow chart of a method 2400 of manufacture of the integrated circuit packaging system 100 in a further embodiment of the present invention. The method 2400 includes: providing a pre-plated leadframe having a contact protrusion and a protective pad on the contact protrusion in a block 2402; forming a contact pad and traces by etching the pre-plated leadframe in a block 2404; applying a trace protection layer on the contact pad, the traces, and the protective pad in a block 2406; removing the protective pad and a portion of the trace protection layer for exposing the contact pad in a block 2408; and depositing an external connector directly on a surface of the contact pad in a block 2410.

Thus, it has been discovered that the method of manufacture of the integrated circuit packaging system 100 of the present invention furnishes important and heretofore unknown and unavailable solutions, capabilities, and functional aspects for cost-effective and reliable manufacture of the integrated circuit packaging system 100.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a pre-plated leadframe having a contact protrusion and a protective pad on the contact protrusion;
   forming a contact pad and traces by etching the pre-plated leadframe;
   applying a trace protection layer on the contact pad, the traces, and the protective pad;
   removing the protective pad and a portion of the trace protection layer for exposing a surface of the contact pad; and
   depositing an external connector directly on the surface of the contact pad.

2. The method as claimed in claim 1 wherein removing the protective pad and a portion of the trace protection layer includes using a backgrinding tool.

3. The method as claimed in claim 1 further comprising forming a recess in the trace protection layer by etching the surface of the contact pad to a recess distance from an exposed surface of the trace protection layer.

4. The method as claimed in claim 1 further comprising:
   connecting an integrated circuit die to the contact protrusion; and
   depositing an encapsulation on the integrated circuit die and the pre-plated leadframe.

5. The method as claimed in claim 1 wherein providing the pre-plated leadframe includes providing the pre-plated leadframe having bond structures opposite the protective pad.

6. A method of manufacture of an integrated circuit packaging system comprising:
   providing a pre-plated leadframe having a contact protrusion, a protective pad on the contact protrusion, and bond structures opposite the protective pad;
   connecting an integrated circuit die to the bond structures;
   depositing an encapsulation on the integrated circuit die and the bond structures of the pre-plated leadframe;
   forming a contact pad and traces by etching the pre-plated leadframe;
   applying a trace protection layer on the contact pad, the traces, and the protective pad;
   removing the protective pad and a portion of the trace protection layer for exposing the contact pad using a backgrinding tool;
   forming a recess in the trace protection layer by etching the surface of the contact pad to a recess distance from an exposed surface of the trace protection layer the surface of the contact pad only exposed in the recess; and
   depositing an external connector directly on a surface of the contact pad.

7. The method as claimed in claim 6 wherein depositing the external connector includes depositing the external connector in the recess.

8. The method as claimed in claim 6 wherein removing the portion of the trace protection layer using a backgrinding tool includes forming the exposed surface of the trace protection layer as uniformly planar.

9. The method as claimed in claim 6 wherein providing the pre-plated leadframe includes providing the pre-plated leadframe having bond structures opposite the protective pad; and further comprising:
   connecting an internal interconnect to the integrated circuit die and the bond structures.

10. The method as claimed in claim 6 wherein applying the trace protection layer includes applying the same material for the trace protection layer as for the encapsulation.

11. An integrated circuit packaging system comprising:
   an integrated circuit die;
   a contact pad connected to the integrated circuit die;
   traces connected to the contact pad;
   a trace protection layer on the contact pad and the traces, the trace protection layer having a recess with an external surface of the contact pad only exposed in the recess and the contact pad spaced a recess distance away from an exposed surface of the trace protection layer; and
   an external connector directly on the external surface of the contact pad.

12. The system as claimed in claim 11 further comprising:
   bond structures on the contact pad; and
   an encapsulation on the integrated circuit die and the bond structures.

13. The system as claimed in claim 11 wherein the contact pad is without a plating layer.

14. The system as claimed in claim 11 wherein the exposed surface of the trace protection layer is uniformly planar.

15. The system as claimed in claim 11 further comprising a die paddle adjacent the contact pad.

16. The system as claimed in claim 11 further comprising:
   a die paddle adjacent the contact pad;
   bond structures on the die paddle and the contact pad; and
   an encapsulation on the integrated circuit die and the bond structures.

17. The system as claimed in claim 16 wherein the integrated circuit die is mounted on the die paddle.

18. The system as claimed in claim 16 further comprising an internal interconnect on and between the integrated circuit die and the bond structures.

19. The system as claimed in claim 16 wherein the encapsulation and the trace protection layer are formed from the same material.

20. The system as claimed in claim 16 wherein the encapsulation and the trace protection layer are formed from epoxy molding compound.

* * * * *